(12) United States Patent
Robb et al.

(10) Patent No.: US 8,748,262 B2
(45) Date of Patent: Jun. 10, 2014

(54) METHOD OF FORMING AN INTEGRATED POWER DEVICE AND STRUCTURE

(75) Inventors: Francine Y. Robb, Fountain Hills, AZ (US); Stephen P. Robb, Fountain Hills, AZ (US); Prasad Venkatraman, Gilbert, AZ (US); Zia Hossain, Tempe, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 180 days.

(21) Appl. No.: 13/458,732

(22) Filed: Apr. 27, 2012

(65) Prior Publication Data

US 2012/0211827 A1    Aug. 23, 2012

Related U.S. Application Data

(62) Division of application No. 12/696,816, filed on Jan. 29, 2010, now Pat. No. 8,207,035, which is a division of application No. 11/095,135, filed on Apr. 1, 2005, now Pat. No. 7,714,381.

(51) Int. Cl.
*H01L 21/336* (2006.01)

(52) U.S. Cl.
USPC ........... 438/259; 438/224; 438/270; 438/272; 438/589

(58) Field of Classification Search
USPC ................ 438/224, 259, 270, 271, 272, 589, 438/E29.005
See application file for complete search history.

(56) References Cited

U.S. PATENT DOCUMENTS

| | | | |
|---|---|---|---|
| 5,122,846 A | 6/1992 | Haken | |
| 5,262,345 A | 11/1993 | Nasser et al. | |
| 5,282,018 A | 1/1994 | Hiraki et al. | |
| 5,559,044 A | 9/1996 | Williams et al. | |
| 5,828,308 A | 10/1998 | Fukami | |
| 6,262,453 B1 | 7/2001 | Hshieh | |
| 6,764,906 B2 | 7/2004 | Darwish | |
| 6,777,745 B2 | 8/2004 | Hshieh et al. | |
| 7,297,603 B2 * | 11/2007 | Robb et al. | 438/289 |
| 7,629,214 B2 * | 12/2009 | Otake et al. | 438/224 |
| 2003/0102564 A1 | 6/2003 | Darwish | |
| 2004/0256680 A1 | 12/2004 | Robb | |

* cited by examiner

*Primary Examiner* — Cuong Q Nguyen
(74) *Attorney, Agent, or Firm* — Robert F. Hightower

(57) ABSTRACT

In one embodiment, a vertical power transistor is formed on a semiconductor substrate with other transistors. A portion of the semiconductor layer underlying the vertical power transistor is doped to provide a low on-resistance for the vertical power transistor.

6 Claims, 9 Drawing Sheets

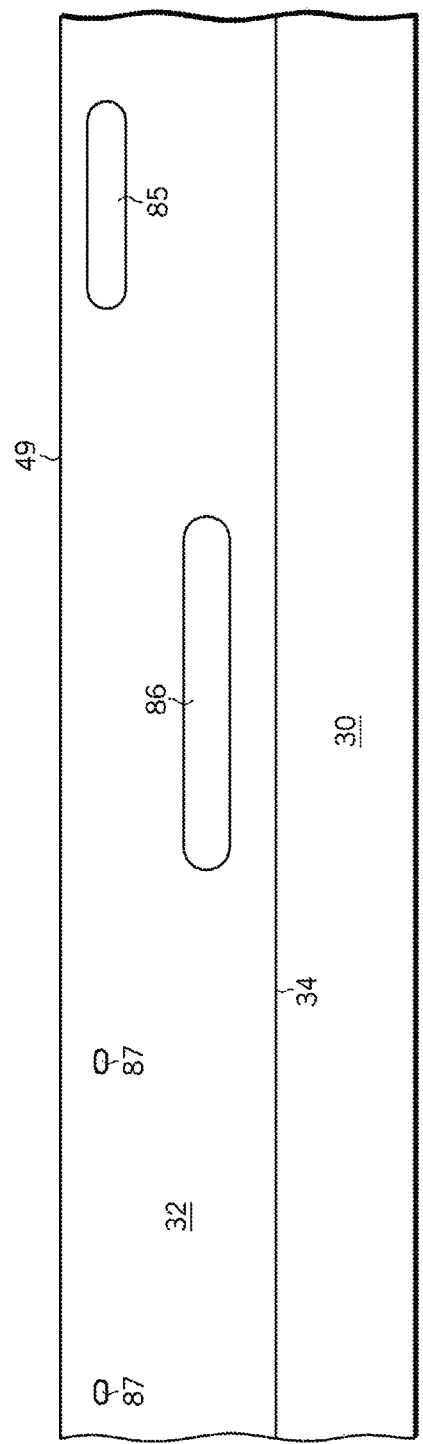
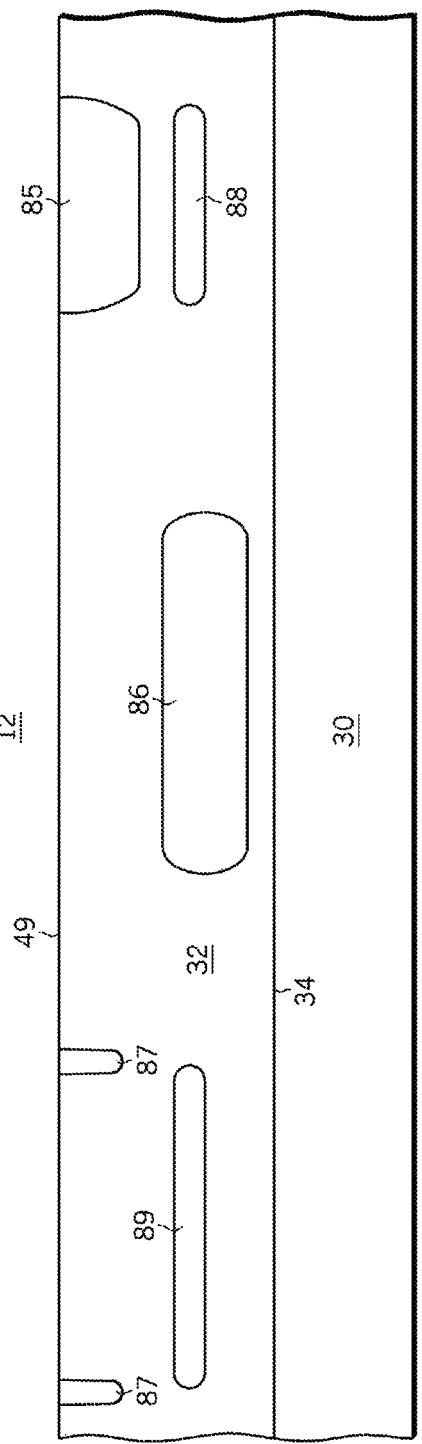

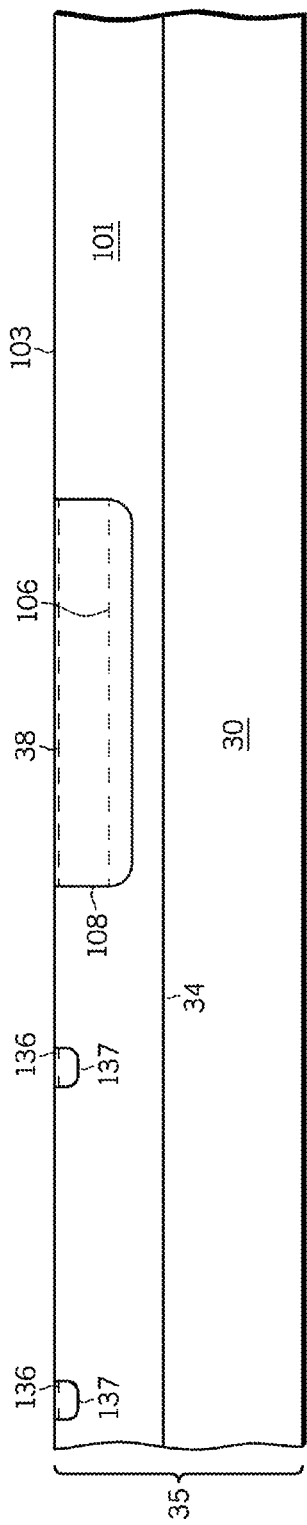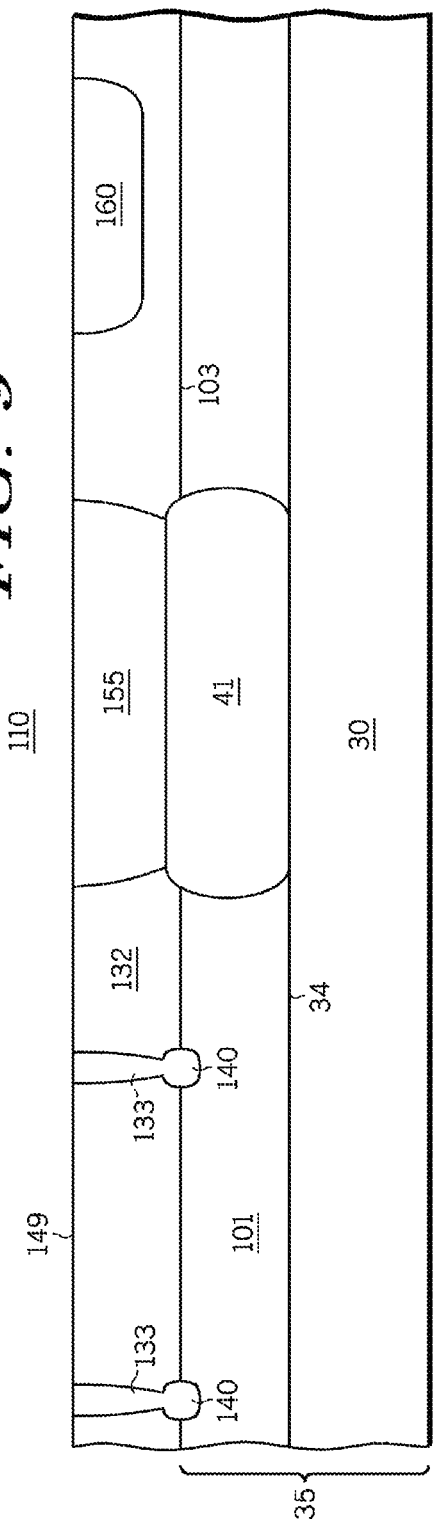

US 8,748,262 B2

METHOD OF FORMING AN INTEGRATED POWER DEVICE AND STRUCTURE

The present application is a divisional application of prior U.S. application Ser. No. 12/696,816 filed on Jan. 29, 2010, now U.S. Pat. No. 8,207,038 which is a divisional of application Ser. No. 11/095,135, filed on Apr. 1, 2005, now U.S. Pat. No. 7,714,381, issued May 11, 2010, both of which are hereby incorporated herein by reference, and priority thereto for common so matter is hereby claimed. Additionally, this application is related to an application entitled "BI-DIRECTIONAL TRANSISTOR AND METHOD THEREFOR" having at least one common inventor, a common assignee, and which issued as U.S. Pat. No. 7,297,603 on Nov. 20, 2007 from application Ser. No. 11/093,381 having a filing date of Mar. 31, 2005

BACKGROUND OF THE INVENTION

The present invention relates, in general, to electronics, and more particularly, to methods of forming semiconductor devices and structure.

In the past, the semiconductor industry utilized various structures and methods to form vertical power transistors on the same substrate with other transistors such as lateral transistors. Forming a vertical power transistor on the same semiconductor die with other transistors was highly desirable and offered designers the flexibility to combine various functions on a single semiconductor die. However, it was difficult to provide a low on-resistance for the vertical power transistor. Typically, the other transistors required a lightly doped semiconductor region in which to form the other transistors. This light doping increased the on-resistance of the vertical power transistor.

Accordingly, it is desirable to have a vertical power transistor formed on the same substrate with other transistors and a vertical power transistor that has low on-resistance.

BRIEF DESCRIPTION OF THE DRAWINGS

FIG. 2 through FIG. 3 illustrates the integrated power device of FIG. 1 at various stages according to an embodiment of a method of forming the integrated power device in accordance with the present invention;

FIG. 8 through FIG. 9 illustrates the integrated power device of FIG. 7 at various stages according to an embodiment of a method of forming the integrated power device of FIG. 7 in accordance with the present invention;

For simplicity and clarity of illustration, elements in the figures are not necessarily to scale, and the same reference numbers in different figures denote the same elements. Additionally, descriptions and details of well-known steps and elements are omitted for simplicity of the description. Although the devices are explained herein as certain N-channel or P-Channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

DETAILED DESCRIPTION OF THE DRAWINGS

Figure 1:
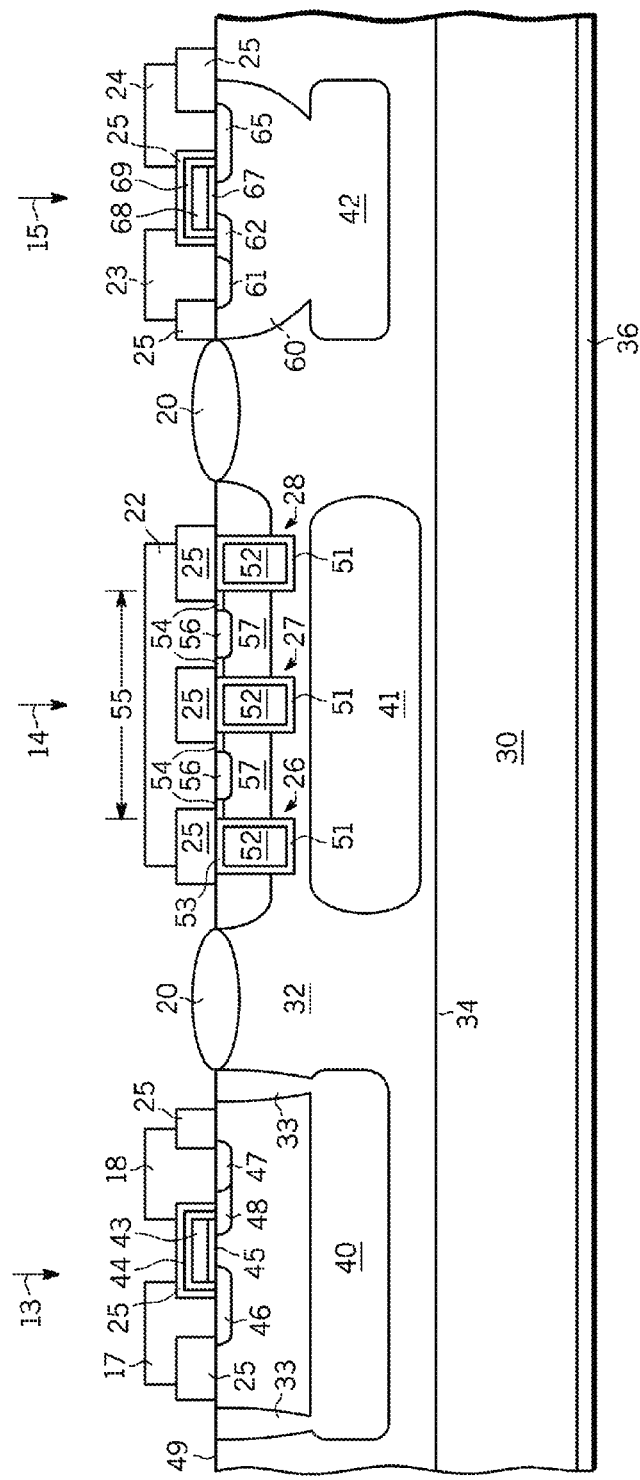
FIG. 1 illustrates an enlarged cross-sectional portion of an embodiment of an integrated power device in accordance with the present invention.

FIG. 1 illustrates an enlarged cross-sectional portion of an embodiment of an integrated power device 12 that includes a vertical power transistor 14 that has a low on-resistance and that is formed on the same semiconductor substrate with a first lateral transistor 13 and a second lateral transistor 15. In the preferred embodiment, transistor 13 is a lateral P-channel transistor, transistor 14 is a vertical N-channel transistor, and transistor 15 is a lateral N-channel transistor. Device 12 is formed on a highly doped N-type bulk semiconductor substrate 30 that has a lightly doped N-type doped semiconductor layer 32, such as an epitaxial layer, formed on a first surface 34 of substrate 30. The resistivity of layer 32 typically is selected to facilitate forming lateral transistors, such as transistors 13 and 15. The resistivity of layer 32 generally is greater than approximately 0.4 ohm-cm and preferably is greater than about 0.8 ohm-cm to 1.0 ohm-cm. The resistivity of substrate 30 typically is less than about 0.01 ohm-centimeter in order to provide a low resistance conduction path for the current that flows through transistor 14, and to provide a low resistance electrical connection to a drain conductor 36 that is formed on a backside of substrate 30. Conductor 36 typically is a metal that is applied to the backside of substrate 30. The combination of substrate 30 and layer 32 may be referred to hereinafter as the substrate.

Transistor 14 includes a P-type body region or doped region 57 that assists in increasing the breakdown voltage of transistor 14 and facilitates forming a channel region during the operation of transistor 14. Region 57 may be referred to as a PHV region. Transistor 14 also includes trench type gates 26, 27, and 28 that are formed to extend from a surface 49 of layer 32 through region 57 and into layer 32. Gates 26, 27, and 28 typically are formed by opening a trench through region 57, forming a dielectric layer 51 along the side walls and bottom of the trench, and forming a gate conductor 52 on layer 51. A dielectric layer 53 typically is formed on top of conductor 52 to fill the remaining of the opening of the trench. N-type doped regions 54 typically are formed adjacent to inside portions of gate 26, 27, and 28 to function as the source regions of transistor 14. Regions 54 extend from surface 49 into region 57 with one horizontal end abutting an adjacent side of dielectric layer 51 and extending laterally toward an opposite dielectric layer 51. P-type doped regions 56 typically are formed to extend from surface 49 through a center portion of regions 54 to make electrical contact with region 57 in order to function as a body contact for transistor 14. A source conductor 22 is applied to surface 49 to make electrical contact to each region 56 and each region 54. Portions of a dielectric layer 25, such as an inter-layer dielectric, are formed on surface 49 above each gate 26, 27, and 28 to isolate conductor 22 from gates 26, 27, and 28. The channel region of transistor 14 typically is considered the portion of region 57 that underlies regions 54. A portion of layer 32 that underlies the channel region typically is referred to as a drift region of the drain of transistor 14. This drift region is identified in a general manner by an arrow 55. An N-type buried layer or doped region 41 is formed within layer 32 to provide a low resistivity drift region for transistor 14. Region 41 typically is formed underlying the channel region of transistor 14 in order to assist in lowering the on-resistance of transistor 14. Region 41 is formed to at least underlie the channel region of transistor 14 and may extend laterally past the channel region and even past the outermost edges of the trench gates, such as gates 26 and 28, of transistor 14. Region 41 generally is positioned vertically close to the lower edges of gates 26-28 and to extend vertically to a position close to surface 34. One edge of region 41 may be between two to five microns from surface 49 and typically is about one micron below the lower edge of gates 26-28. The deepest edge of region 41 preferably extends to make electrical contact with substrate 30 but may not make such electrical contact in some embodiments.

Transistor 15 is formed in another portion of surface 49. A P-type doped region 60 is formed extending from surface 49 into layer 32 in order to form a well region within layer 32 which isolates transistor 15 from layer 32 and other devices formed within layer 32. N-type doped regions 62 and 65 are formed spaced apart on surface 49 and extending into region 60 to form respective source and drain regions of transistor 15. A P-type doped region 61 is formed on surface 49 and extending into region 60 to abut an end of region 62 that is distal from region 65 to form a body contact for transistor 15. A gate of transistor 15 is formed overlying a portion of region 60 that is positioned between regions 62 and 65. The gate includes a gate dielectric 67, for example silicon dioxide, that is formed to overlie surface 49, a gate conductor 68 that is formed on dielectric 67, and a protective layer 69 that is formed to cover conductor 68 in order to electrically isolate conductor 68 from other electrical elements. A source conductor 23 is formed to make electrical contact to regions 61 and 62, and a drain conductor 24 is formed to make electrical contact to region 65. Portions of dielectric layer 25 isolate conductors 23 and 24 from layer 32. A P-type buried layer or doped region 42 may be formed within layer 32 to intersect region 60 in order to assist in isolating transistor 15 from other elements of device 12 including reducing the gain of parasitic transistors and minimizing punch through effects.

Transistor 13 is formed in an isolated portion of the substrate that is isolated from other portions of the substrate and from other elements of device 12. A P-type vertical isolation region 33 is formed to surround a portion of surface 49 and extend into layer 32 to assist in isolating a first portion of layer 32 from other portions of layer 32, thereby forming a first isolated region of the substrate. Region 33 typically is formed as a hollow geometric shape, such as a rectangular doughnut, that surrounds the first portion of layer 32 in which transistor 13 is to be formed. Typically, a P-type buried layer or doped region 40 is formed in layer 32 to underlie transistor 13 in order to assist in forming the first isolation region. Region 40 generally is positioned vertically within layer 32 to provide sufficient thickness of layer 32 to form transistor 13 within the isolated region and to ensure that region 40 does not contact substrate 30. The upper edge of region 40 generally is about one to four (1-4) microns from surface 49 to assist in improving the breakdown voltage of transistor 13. The peak doping concentration of region 40 is approximately two to five (2-5) microns from surface 49. Region 40 is formed to intersect regions 33 which reduces the distance that regions 33 must extend into layer 32. The further region 40 extends toward surface 49 the shallower regions 33 may be. Minimizing the depth of regions 33 increases the doping concentration and uniformity of the doping profile of regions 33 and also reduces the width of regions 33. An optional N-doped region, such as an N-well, can be formed within the isolated region of the first portion of layer 32 to increase the threshold of transistor 13 and reduce vertical depletion effects. Transistor 13 includes P-type doped regions 46 and 48 that are formed to be spaced apart on surface 49 and within the first portion of layer 32. Regions 46 and 48 extend into layer 32 to form respective drain and source regions of transistor 13. An N-type doped region 47 is formed to extend from surface 49 into layer 32 and abut a side of region 48 that is distal to region 46 to function as a body contact that provides electrical contact to the portion of layer 32 that is surrounded by regions 33 and 40.

Field isolation regions 20 are formed on surface 49 and disposed between transistors 13, 14, and 15 to assist in isolating the transistors as is well known to those skilled in the art.

FIG. 2 illustrates device 12 at an early manufacturing stage according to an embodiment of a method of forming device 12. An epitaxial layer is formed on surface 34 to form doped semiconductor layer 32. Doped semiconductor layer 32 typically has a thickness no greater than approximately ten (10) microns and a resistivity that is generally greater than about 0.4 ohm-cm and preferably greater than about 0.8 ohm-cm to 1.0 ohm-cm.

High energy implants are used to form regions 40, 41, 42, 60 and 33 within layer 32. Surface 49 is masked to expose the portions of surface 49 overlying where regions 33 and 60 are to be formed. Boron is implanted at a dose of about 5E12 to 1E13 atoms/cm$^2$ at an energy of approximately 550 Kev to 1.0 Mev to form the center of dopants 85 and 87 at a distance of about one to two (1-2) microns from surface 49. Dopants 85 will become region 60 and dopants 87 subsequently will become regions 33. Phosphorous is implanted at a dose of about 3E12 to 1E14 atoms/cm$^2$ at an energy of 1.0 Mev to 5.0 Mev to form the center of dopants 86 a distance of about one to three (1-3) microns from surface 49. Dopants 86 will subsequently become region 41.

FIG. 3 illustrates device 12 at a subsequent manufacturing stage. Dopants 85, 86, and 87 are activated to drive the dopants into layer 32. The activation is performed at approximately eleven hundred fifty (1150) degrees for about ninety (90) minutes in a nitrogen atmosphere. Thereafter, surface 49 is masked to expose the portions overlying where regions 40 and 42 are to be formed. Boron is implanted at a dose of about 5E12 to 1E14 atoms/cm$^2$ at an energy of approximately 2.0 Mev to 3.0 Mev and preferably about 2.8 Mev to form the center of dopants 88 and 89 a distance of about two to four (2-4) microns from surface 49. Dopants 88 and 89 will subsequently become respective regions 42 and 40. The temperatures used in subsequent processing operations, such as forming field isolation regions 20, and layer 51, function to further activate dopants 85, 86, 87, 88, and 89 and diffuse the dopants outward to assist in forming respective regions 60, 41, 33, 42, and 40.

The masking operations referred to in the description of FIG. 2 and FIG. 3 may include forming an implantation barrier, such as silicon dioxide, having thin sections or opening overlying where the dopants are to be positioned. A photoresist mask usually is formed on the implantation barrier to further control the positioning of the dopants.

Figure 4:
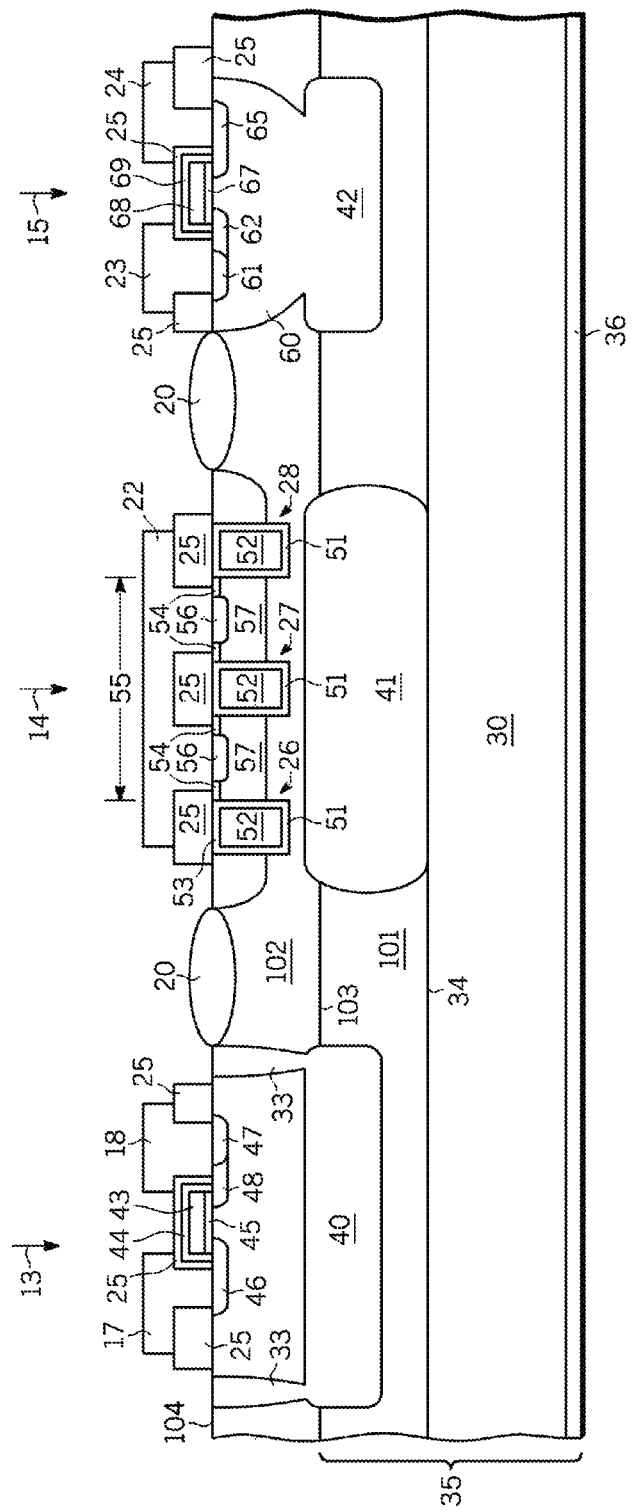
FIG. 4 illustrates an enlarged cross-sectional portion of an alternate embodiment of the integrated power device of FIG. 1 in accordance with the present invention.

FIG. 4 illustrates an enlarged cross-sectional view of an integrated power device 100 that is an alternate embodiment of device 12 explained in the description of FIGS. 1-3. Device 100 is similar to device 12 except that doped semiconductor layer 32 is replaced with a first doped semiconductor layer 101 and a second doped semiconductor layer 102. In the preferred embodiment, layer 101 is an N-type epitaxial layer formed on surface 34 and layer 102 is an N-type epitaxial layer formed on a surface 103 of layer 101. Layer 102 has a surface 104 that is similar to surface 49 of device 12 (FIG. 1). Regions 33, 40, 41, 42, and 60 may be formed by a method similar to the method explained in the description of FIGS. 2 and 3 or by another method.

Figure 5:
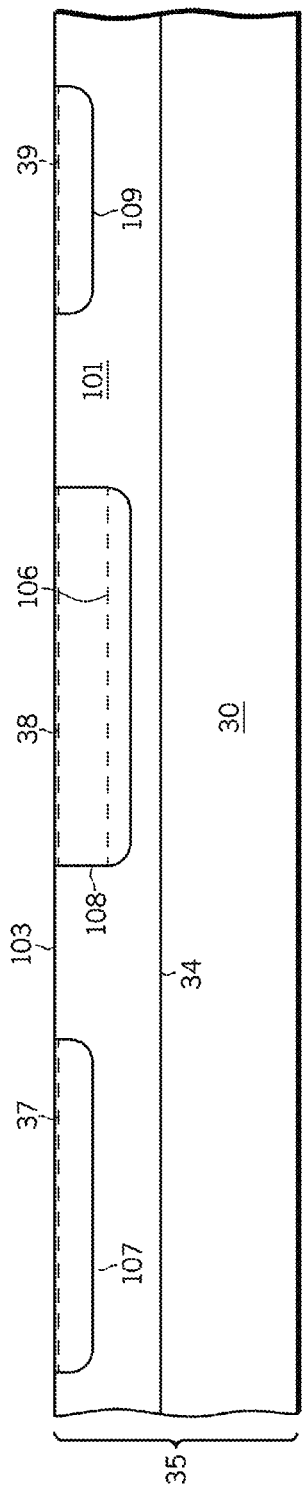
FIG. 5 through FIG. 6 illustrates the integrated power device of FIG. 4 at various stages according to an embodiment of a method of forming the integrated power device of FIG. 4 in accordance with the present invention.

FIG. 5 illustrates device 100 at an early manufacturing stage according to an embodiment of a method of forming device 100. Layer 101 is formed on surface 34 of substrate 30 prior to forming doped regions 40, 41, and 42 and layer 102. Layer 101 typically has a thickness of about five (5) microns and a resistivity that is similar to the resistivity of layer 32. Substrate 30 and layer 101 function as a substrate 35 upon which layer 102 is formed. Additionally, substrate 35 together with layer 102 may be referred to hereinafter as the substrate.

In order to form region 41, a portion of surface 103 overlying where region 41 is to be positioned is doped with N-type dopants, such as phosphorous, while the remainder of surface 103 is masked to form dopants 38, illustrated by a dashed line, in layer 101. In one embodiment, phosphorous is implanted with a dose of about 2E14 atoms/cm$^2$ at sixty (60) KeV in order to form dopants 38. Dopants 38 are then driven into layer 101 by a first activation. A dashed line 106 illustrates one possible position of dopants 38 after the first activation. The first activation generally is performed at about twelve hundred (1200) degrees Celsius for approximately one hundred (100) minutes. Similarly, in order to form regions 40 and 42, portions of surface 103 overlying where regions 40 and 42 are to be positioned are doped with P-type dopants, such as boron, while the remainder of surface 103 is masked to form respective dopants 37 and 39 in layer 101. In one embodiment, boron is implanted with a dose of about 1.5E13 atoms/cm$^2$ at sixty (60) KeV to form dopants 37 and 39. Thereafter, a second activation is used to activate dopants 37 and 39 into layer 101 and to drive dopants 38 further into layer 101. The second activation is usually performed at about nine hundred (900) degrees Celsius for approximately sixty (60) minutes to form dopants 37, 38, and 39. The second activation of dopants 37, 38, and 39 drive the dopants into layer 101 to form respective regions 107, 108, and 109 into layer 101. Dopants 37 and 39 have a peak doping that is positioned close to surface 103 and a peak doping of dopants 38 is also close to surface 103 and typically is less than about 0.5 microns from surface 103.

Figure 6:
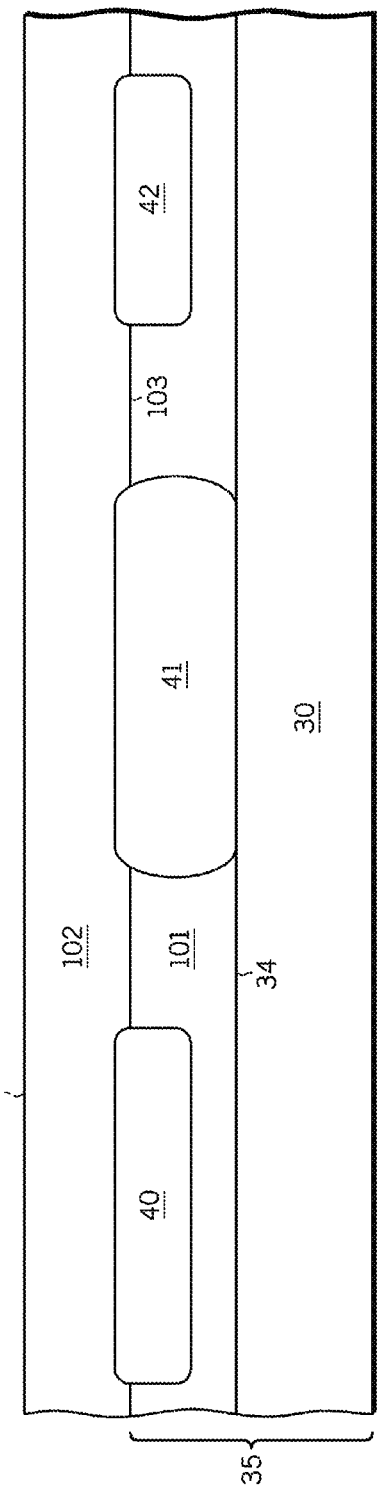

FIG. 6 illustrates device 100 at a subsequent manufacturing stage. Doped semiconductor layer 102 is formed on surface 103 with a thickness no greater than approximately five (5) microns and a resistivity that is typically greater than about 0.4 ohm-cm and preferably greater than about 0.8 ohm-cm and 1.0 ohm-cm. During the formation of layer 102, dopants 37, 38, and 39 diffuse into layer 102 and about an approximately equal amount further into layer 101 to form respective regions 40, 41, and 42. The respective peak doping concentrations of regions 40, 41, and 42 are all approximately 1E15 to 1E18 atoms/cm$^3$. As will be appreciated by those skilled in the art, the peak doping concentration of regions 40, 41, and 42 occurs near the interface of layers 101 and 102 at surface 103 or approximately three to five (3-5) microns from surface 104. Forming the peak doping of region 41 such a distance from surface 104 facilitates decreasing the resistivity of layers 101 and 102 thereby reducing the on-resistance of transistor 14. Forming the peak doping of regions 40 and 42 such a distance from surface 104 assists in reducing the vertical depletion effects. Using multiple epitaxial layers and positioning the dopants of regions 40, 41, and 42 between two of the layers allows forming the peak doping concentration of regions 40, 41, and 42 and particularly region 41 deep into the epitaxial layers and near substrate 30 thereby lowering the on-resistance of transistor 14.

Thereafter, a P-type dopant, such as boron, may be implanted into layer 102 in order to form regions 33 at a depth that intersects region 40. Regions 33 may also be formed by forming a trench that extends from surface 104 to region 40 and filling the trench with doped material such as polysilicon. Alternately, regions 33 may also be formed as heavily doped sinkers that are diffused from surface 104 into layer 102 to form region 33. Thereafter, P-type doped regions 57 and 60 may be formed on surface 104 and extending into layer 102. Region 60 is formed to extend to intersect region 42. Thereafter, transistor 13 is formed in the isolated portion of the substrate, transistor 14 is formed in region 57, and transistor 15 is formed in region 60.

Figure 7:
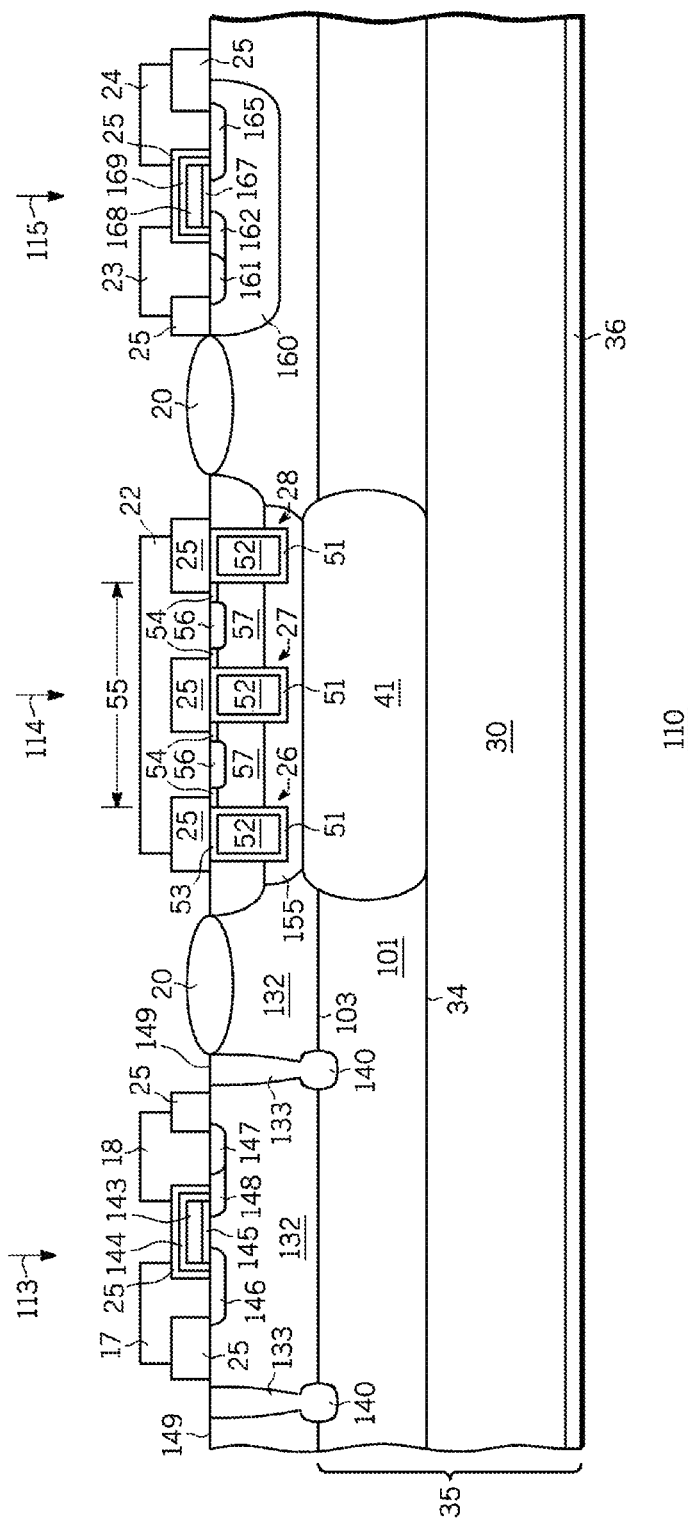
FIG. 7 illustrates an enlarged cross-sectional portion of a second alternate embodiment of the integrated power device of FIG. 1 in accordance with the present invention.

FIG. 7 illustrates an enlarged cross-sectional view of an integrated power device 110 that is an alternate embodiment of device 100 that was an explained in the description FIG. 4 through FIG. 6. Integrated power device 110 includes a vertical power transistor 114 that has a low on-resistance and that is formed on the same semiconductor substrate with a first lateral transistor 113 and a second lateral transistor 115. In the preferred embodiment, transistor 113 is a lateral N-channel transistor, transistor 114 is a vertical N-channel transistor, and transistor 115 is a lateral P-channel transistor. Device 110 includes substrate 30, layer 101, region 41, and a lightly doped P-type doped semiconductor layer 132 that is formed on surface 103. The value of the resistivity of layer 132 is substantially the same as layer 102 (FIG. 4) to facilitate forming lateral transistors, such as transistors 113 and 115 in layer 132. Substrate 35 plus layer 132 may be referred to hereinafter as the substrate.

Transistor 114 is formed on a first portion of the substrate on a surface 149 of layer 132. Transistor 114 is similar to transistor 14 (FIG. 4) but has an N-type doped region 155 that functions as a portion of a low resistance drift region of transistor 114. Region 155 is formed to extend from the lower surface of region 57 into layer 132 to intersect region 41.

Transistor 115 is formed in a second portion of the substrate on surface 149. An N-type doped region 160 is formed extending from surface 149 into layer 132 in order to form a well region which isolates transistor 115 from layer 132 and other devices formed within layer 132. P-type doped regions 162 and 165 are formed spaced apart on surface 149 and extending into region 160 to form respective source and drain regions of transistor 115. An N-type doped region 161 is formed on surface 149 and extending into region 160 to abut an end of region 162 that is distal from region 165 in order to form a body contact to region 160. A gate of transistor 115 is formed overlying the portion of region 160 that is disposed between regions 162 and 165. The gate includes a gate dielectric 167, for example silicon dioxide, that is formed to overlie surface 149, a gate conductor 168 that is formed on dielectric 167, and a protective layer 169 that is formed to cover conductor 168 in order to electrically isolate conductor 168 from other electrical elements. Source conductor 23 is formed to make electrical contact to regions 161 and 162, and drain conductor 24 is formed to make electrical contact to region 165. Portions of dielectric layer 25 isolate conductors 23 and 24 from layer 132.

An optional P-type doped region may be formed within layer 132 and underlying transistor 115 to extend to intersect region 160 in order to assist in isolating transistor 115 from other elements of device 110.

Transistor 113 is formed in a third portion of the substrate that is isolated from other portions of the substrate and from other elements of device 110. N-type vertical isolation region 133 is formed to surround a portion of surface 149 and extend into layer 132 to isolate the third portion of layer 132 from other portions of layer 132. Region 133 typically is formed as a hollow geometric shape that surrounds the third portion of layer 132 in which transistor 113 is to be formed. Typically, an N-type buried layer or doped region 140 is formed at least at the interface of layer 132 and layer 101 and underlying region 133 in order to assist in forming the isolated region of the substrate. Forming region 140 at least under region 133 reduces the distance that region 133 must extend into layer 132. The further region 140 extends toward surface 149 from surface 130 the shallower region 133 may be. Minimizing the depth of region 133 increases the doping concentration and uniformity of the doping profile of region 133. Since there is a P-N junction at the interface of layers 132 and 101, it is not necessary for region 140 to extend under all of transistor 113, however, region 140 may be formed to underlie all of transistor 113. Transistor 113 includes N-type doped regions 146 and 148 that are formed to be spaced apart on surface 149 and within the third portion of layer 132. Regions 146 and 148 extend into layer 132 to form respective drain and source regions of transistor 113. A P-type doped region 147 is formed to extend from surface 149 into layer 132 and abut a side of region 148 that is distal to region 146 to function as a body contact that provides electrical contact to the portion of layer 132 that is surrounded by region 133. An optional P-type region may be formed in the isolated region to increase threshold and reduce vertical depletion effects.

FIG. 8 illustrates device 110 at an early manufacturing stage according to an embodiment of a method of forming device 110. Region 41 is formed similarly to region 41 as explained in the description of FIGS. 4-6 by first forming dopants 38 and activating dopants 38 as illustrated by dashed lines 106. In order to form region 140, portions of surface 103 overlying where region 140 is to be positioned are doped with N-type dopants, such as phosphorous, while the remainder of surface 103 is masked to form dopants 136 in layer 101. In one embodiment, phosphorous is implanted with a dose of about 5E13 atoms/cm$^2$ at sixty (60) KeV in order to form dopants 136. Thereafter, a second activation is used to drive dopants 136 into layer 101 and to drive dopants 38 further into layer 101. The second activation usually is at about nine hundred (900) degrees Celsius for approximately sixty (60) minutes. The second activation of dopants 38 and 136 drive the dopants into layer 101 to form respective regions 137 and 108. Dopant 136 having a peak doping that is positioned close to surface 103 and a peak doping of dopant 38 is also positioned close to surface 103 and typically no greater than about 0.5 microns into layer 101 from surface 103.

FIG. 9 illustrates device 110 at a subsequent manufacturing stage. A P-type epitaxial layer is formed on surface 103 to form layer 132. During the formation of layer 132, the dopants from regions 137 and 108 diffuse into layer 132 and further into layer 101 to form respective regions 140 and 41. The doping concentration of region 140 is approximately 1E15 to 1E18 atoms/cm$^3$. Thereafter, N-type dopants are implanted into layer 132 in order to form region 133 at a depth that intersects region 140 and to form region 155 that intersects region 41. N-type dopants may subsequently be implanted into layer 132 in order to form region 160. In order to form regions 133, 155, and 160 may require a subsequent high temperature anneal of about twelve hundred (1200) degrees Celsius for approximately one hundred (100) minutes.

P-type doped region 57 is formed on surface 149 and extending into layer 132. A portion of region 57 overlaps region 155 and counter-dopes the dopants of region 155. Thereafter, transistor 113 is formed in the isolated portion of the substrate, transistor 114 is formed in region 57 and region 155, and transistor 115 is formed in region 160.

Regions 41, 133, 140, and 160 may also be formed by other techniques as explained in the description of FIGS. 1-3.

Figure 10:
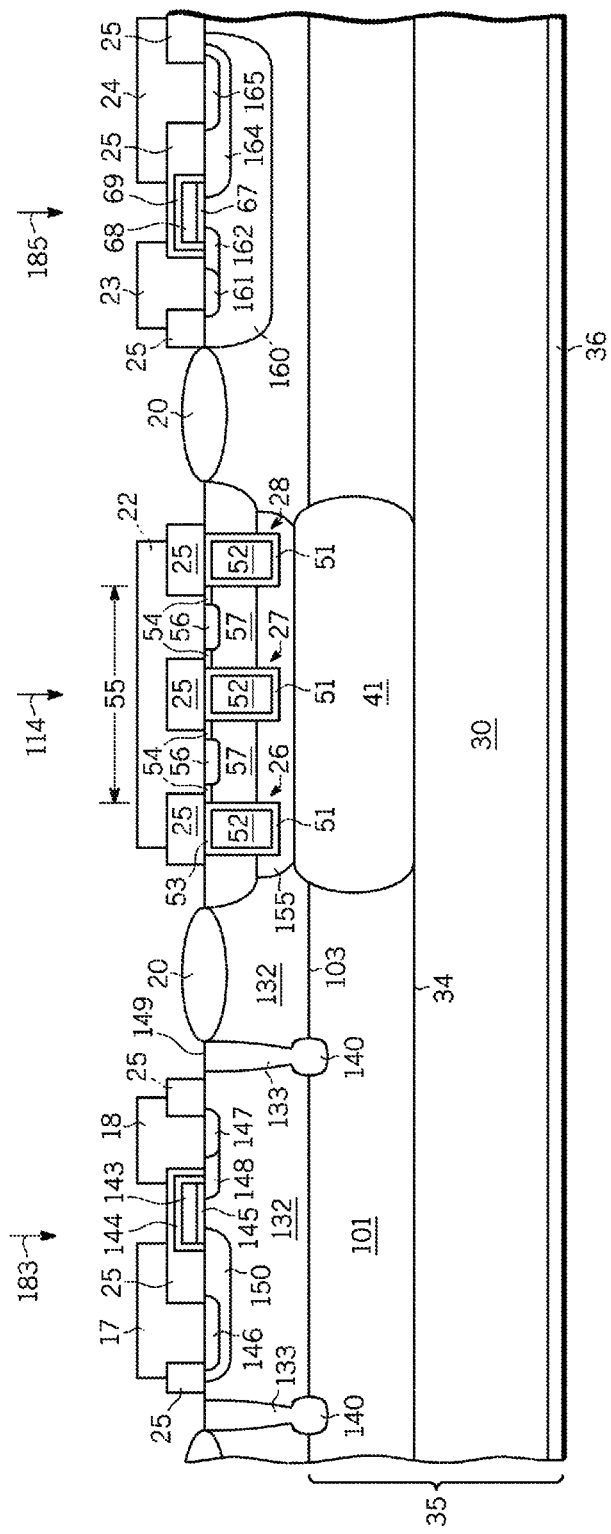
FIG. 10 illustrates an enlarged cross-sectional portion of an alternate embodiment of the integrated power device of FIG. 7 in accordance with the present invention.

FIG. 10 illustrates an enlarged cross-sectional view of an integrated power device 180 that is an alternate embodiment of device 110 that was an explained in the description FIG. 7 through FIG. 9. Device 180 includes transistors 183 and 185 that are alternate embodiments of transistors 113 and 115, respectively. Transistor 183 includes an N-type region 150 that is formed on surface 149 and to underlie at least a portion of the gate of transistor 183. Drain region 146 is formed within region 150 and distal from the gate in order to increase the breakdown voltage of transistor 183. Similarly, transistor 185 includes a P-type region 164 that is formed on surface 149 and to underlie at least a portion of the gate of transistor 185. Drain doped region 165 is formed within region 164 and distal from the gate in order to increase the breakdown voltage of transistor 185. Those skilled in the art will appreciate that transistors 183 and 185 may also be formed as a part of device 12 (FIG. 1) or device 100 (FIG. 4).

Figure 11:
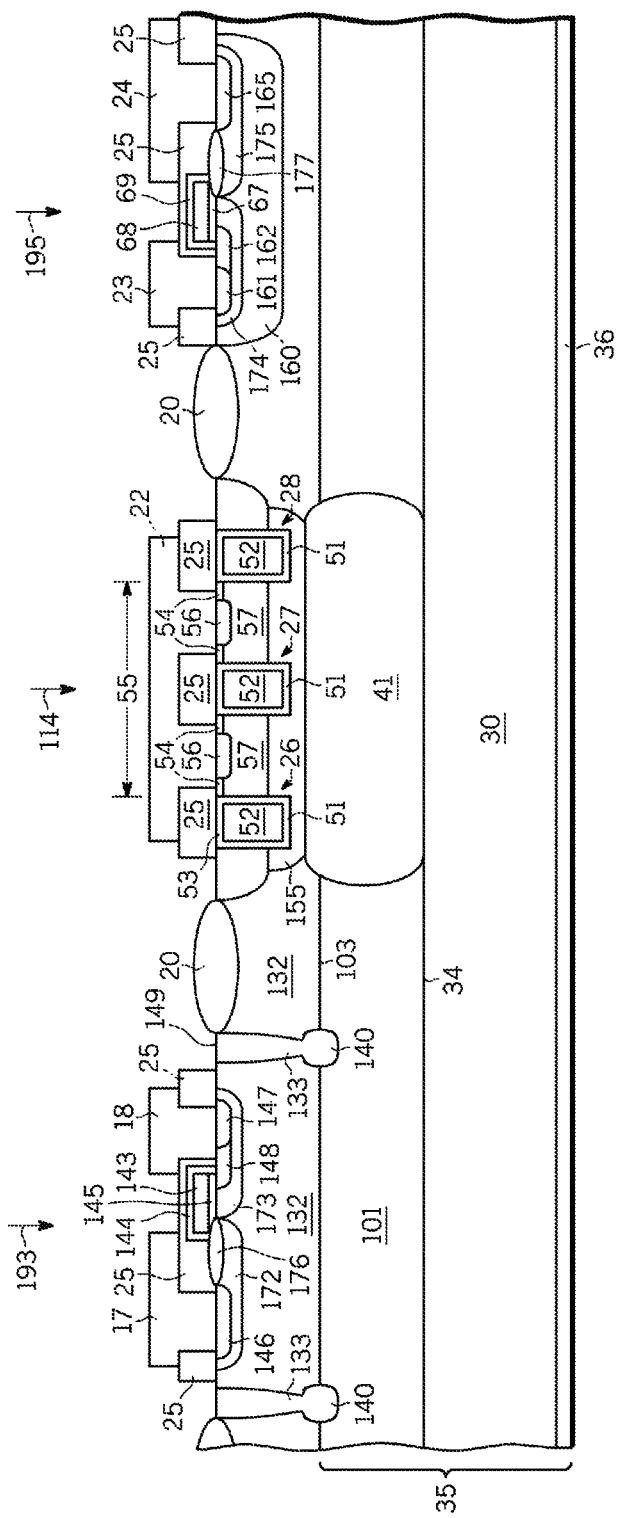
FIG. 11 illustrates an enlarged cross-sectional portion of another alternate embodiment of the integrated power device of FIG. 7 in accordance with the present invention.

FIG. 11 illustrates an enlarged cross-sectional view of an integrated power device 190 that is an alternate embodiment of device 180 that was an explained in the description FIG. 10. Device 190 includes transistors 193 and 195 that are alternate embodiments of transistors 183 and 185, respectively. Transistor 193 includes an N-type region 172 that is formed as an alternate embodiment of region 150 (FIG. 10). Region 172 is wider than region 150 to facilitate moving region 146 further from the gate in order to assist in increasing the breakdown voltage of transistor 193. Drain doped region 146 is formed within region 172. A field dielectric 176 is formed on surface 149 between the gate of transistor 193 and region 146. Transistor 193 also includes a P-type doped region 173 that is formed on surface 149 and to underlie at least a portion of the gate of transistor 193. Doped regions 147 and 148 are formed within region 173. Region 173 also assists in increasing the breakdown voltage of transistor 193. Similarly, transistor 195 includes a P-type region 175 that is an alternate embodiment of region 164. Region 175 is wider than region 164 to facilitate moving region 165 further from the gate in order to assist in increasing the breakdown voltage of transistor 195. Drain doped region 165 is formed within region 175. A field dielectric 177 is formed on surface 149 between the gate of transistor 195 and region 165. Transistor 195 also includes an N-type doped region 174 that is formed on surface 149 and to underlie at least a portion of the gate of transistor 195. Doped regions 161 and 162 are formed within region 174. Region 174 also assists in increasing the breakdown voltage of transistor 195. Those skilled in the art will appreciate that transistors 193 and 195 may also be formed as a part of device 12 (FIG. 1) or device 100 (FIG. 4).

Figure 12:
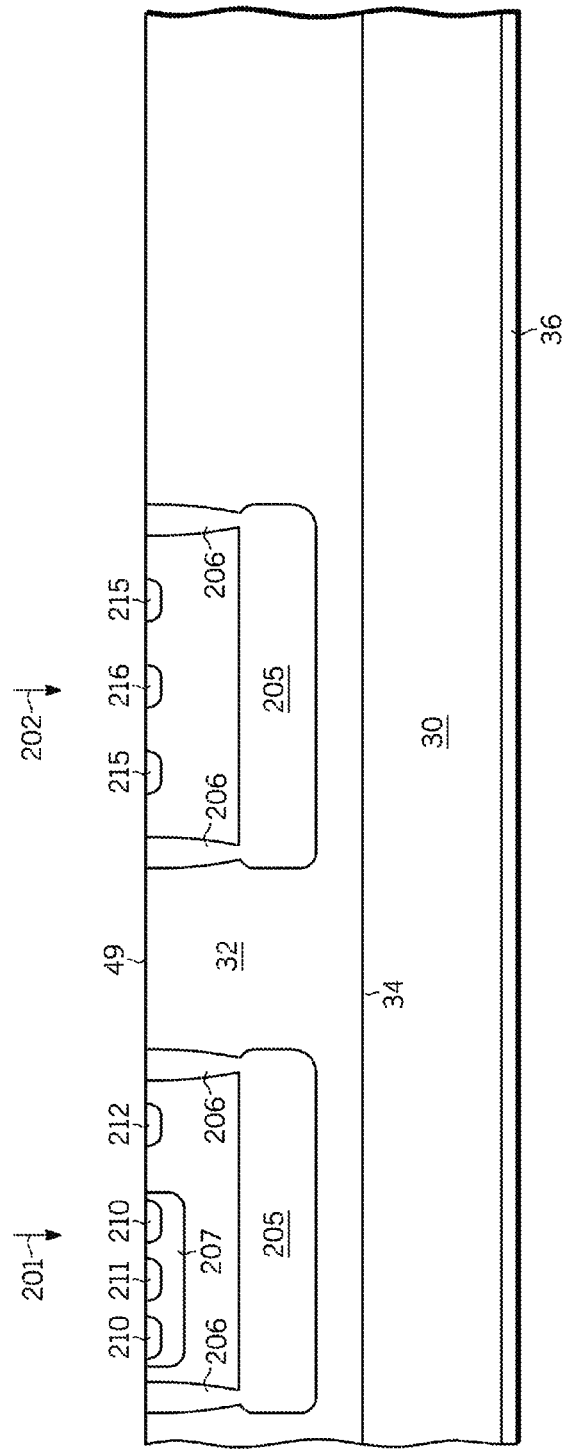
FIG. 12 illustrates an enlarged cross-sectional portion of an embodiment of another portion of the integrated power device of FIG. 1 in accordance with the present invention.

FIG. 12 illustrates an enlarged cross-sectional portion of an embodiment of another portion of device 12 that was not illustrated in FIG. 1 and was not explained in the description of FIG. 1. The additional portion of device 12 illustrated in FIG. 12 includes a bipolar transistor 201 and a bipolar transistor 202 that are formed in layer 32. Transistors 201 and 202 are formed in respective second and third isolated regions of layer 32 that are similar to the first isolated region surrounding transistor 13 as explained in the description of FIG. 1. The second and third isolated regions are isolated from each other and from other portions of layer 32. P-type buried layers or doped regions 205 are formed in layer 32 to be similar to region 40 (FIG. 1). P-type vertical isolation regions 206 are formed to be similar to regions 33 and surround portions of surface 49 and extend into layer 32 to intersect regions 205. Regions 206 and 205 assist in isolating the second portion and third portion of layer 32 from other portions of layer 32.

Transistor 201 includes a P-type region 207 formed within the second isolated region and on the surface of layer 32 to function as the base of transistor 201. A P-type region 210 is formed on the surface of layer 32 and within region 207 to function as a contact to region 207. Region 210 is generally formed as a hollow geometric shape on the surface of layer 32. An N-type region 211 is formed on the surface of layer 32 and within region 207 to function as the emitter of transistor 201. A portion of layer 32 is surrounded by regions 205 and 206 and functions as isolation to isolate transistor 201 from other element of device 12. An N-type region 212 is formed on the surface of layer 32 within the second isolation region and external to region 207 to form a contact to the portion of layer 32 enclosed within the second isolated region. This enclosed portion of layer 32 functions as the collector of transistor 201.

Transistor 202 is formed on the surface of layer 32 and within the third isolated region layer 32. An N-type region 215 is formed on the surface of layer 32 and within the third isolated region to function as a base of transistor 202. Region 215 is generally formed as a hollow geometric shape on the surface of layer 32. A P-type region 216 is formed on the surface of layer 32 within region the third isolated region to function as the emitter of transistor 201. Region 216 generally is surrounded by region 215. Regions 205 and 206 function as the collector of transistor 202. An electrical contact may be formed to one portion of region 206 in order to form electrical contact to the collector of transistor 202.

In view of all of the above, it is evident that a novel device and method is disclosed. Included, among other features, is forming a doped region underlying the channel region of a vertical transistor and positioned a distance from the surface on which the vertical transistor is positioned. Positioning the peak doping of the doped region at the distance from the surface facilitates easily controlling device parameters, such as the threshold voltage and breakdown voltage, and produces a lower on-resistance for a given breakdown voltage.

While the invention is described with specific preferred embodiments, it is evident that many alternatives and variations will be apparent to those skilled in the semiconductor arts. More specifically the invention has been described for a particular N-channel vertical power transistor structure, although the method is directly applicable to P-channel vertical power transistors and other transistor structures.

The invention claimed is:

1. A method of forming an integrated power device comprising:
   providing a semiconductor substrate of a first conductivity type having a surface;
   forming a first semiconductor layer of the first conductivity type on the surface of the semiconductor substrate, the first semiconductor layer having a surface;
   forming a first doped region in the first semiconductor layer;
   forming a second semiconductor layer on the surface of the first semiconductor layer; and
   forming a vertical transistor on the surface of the second semiconductor layer including forming a plurality of channel regions of the vertical transistor overlying the first doped region.

2. The method of claim 1 wherein forming the first doped region includes forming the first doped region on the surface of first layer by doping the first semiconductor layer and activating dopants.

3. The method of claim 1 wherein forming the first semiconductor layer includes forming a first epitaxial layer of the first conductivity type on the surface of the semiconductor substrate.

4. The method of claim 3 wherein forming the second semiconductor layer includes forming a second epitaxial layer of the first conductivity type on the surface of the first semiconductor layer.

5. The method of claim 1 further including forming a second doped region in the first semiconductor layer and spaced apart from the first doped region, and forming a first lateral transistor overlying the second doped region.

6. The method of claim 5 further including forming a third doped region, in the first semiconductor layer and spaced apart from the first doped region, and forming a second lateral transistor overlying the second doped region.

* * * * *